United States Patent [19]
Leou et al.

[11] Patent Number: 6,150,763
[45] Date of Patent: Nov. 21, 2000

[54] INDUCTIVELY-COUPLED HIGH DENSITY PLASMA PRODUCING APPARATUS AND PLASMA PROCESSING EQUIPMENT PROVIDED WITH THE SAME

[75] Inventors: Keh-Chyang Leou; Chai-Hao Chang; Szu-Che Tsai; Tsang-Lang Lin, all of Hsinchu, Taiwan; Chuen-Horng Tsai, 101 Sec. 2, Kuang-fu Rd., Hsinchu, Taiwan

[73] Assignee: Chuen-Horng Tsai, Taiwan

[21] Appl. No.: 09/267,950

[22] Filed: Mar. 11, 1999

[30] Foreign Application Priority Data

Feb. 11, 1998 [TW] Taiwan .................................. 87118176

[51] Int. Cl.$^7$ ...................................................... H01J 7/24
[52] U.S. Cl. .................. 315/111.51; 315/111.21; 118/723 AN; 118/723 I
[58] Field of Search .......................... 315/111.21, 111.51; 118/723 I, 723 IR, 723 AN; 156/345

[56] References Cited

FOREIGN PATENT DOCUMENTS 6068839   3/1994   Japan .................................. 315/111.21

*Primary Examiner*—Michael B Shingleton
*Attorney, Agent, or Firm*—Fulbright & Jaworski L.L.P.

[57] ABSTRACT

This invention relates to an inductively-coupled high density plasma producing apparatus and a plasma processing equipment having the apparatus. The plasma processing equipment consists of a shape-adjustable coil (antenna), a RF power generator, an impedance matching network, a plasma chamber, a gas supply system, and a vacuum system. The gases for producing plasma are fed into the plasma chamber. The RF power is fed into the coil to produce plasma in the plasma chamber. This invention is characterized by the provision of a shape-adjustable coil, which is used to shape the RF power profile in the plasma chamber such that the plasma density profile (uniformity) can be controlled.

7 Claims, 3 Drawing Sheets

INDUCTIVELY-COUPLED HIGH DENSITY PLASMA PRODUCING APPARATUS AND PLASMA PROCESSING EQUIPMENT PROVIDED WITH THE SAME

BACKGROUND OF THE INVENTION

1. Field of the Invention

The invention relates to an inductively-coupled high density plasma producing apparatus and plasma processing equipment provided with the same, and more particularly to an inductively-coupled high density plasma producing apparatus which includes a shape-adjustable coil for increasing the adjustable ranges of control parameters in the semiconductor processing, and the plasma processing equipment provided with them same.

2. Description of the Related Art

In the semiconductor process, such as etching, chemical vapor deposition, sputtering, and photoresist removing, the plasma source, i.e., a plasma producing apparatus has been widely used. Furthermore, in line with the continuous developments of technology, the plasma source with a low plasma density is increasingly replaced by one with a high plasma density. The characteristics of the plasma, especially the uniformity of the plasma density, extremely affect the quality of products. A poor plasma density not only causes a poor uniformity of layers formed in the semiconductor process, but damages the formed devices, thereby resulting in a poor yield. In addition to a number of processing parameters, such as components of the gas, pressure, plasma source, RF power bias of a wafer stage, it is found that designs of the plasma chamber can also affect the uniformity of the plasma. Moreover, even though the processing parameters, such as pressure, voltage, gas flow, can be adjusted to make the plasma as uniform as possible in coordination with different processes, the adjustable ranges thereof are completely different in light of different processes. Therefore, the adjustable ranges of the processing parameters become are limited. As a result, it is impossible to obtain a satisfied plasma uniformity if the processing parameters are out of the adjustable ranges.

To overcome this problem, various approaches are used to obtain a satisfied uniformity of plasma instead of controlling the parameters. For example, a conventional parallel-plate plasma etching machine has been disclosed in U.S. Pat. No. 4,626,312. The disclosed etching machine includes an upper electrode and a lower electrode, and a wafer is placed on the lower electrode, between which the plasma being produced by the supply of an RF power. Furthermore, a planar coil used to increase the uniformity of the plasma has been disclosed in U.S. Pat. No. 4,948,458. A conventional magnetically-coupled plasma producing apparatus 10 is shown in FIG. 1. The plasma producing apparatus 10 is mounted on a housing 12 and includes a primary coil 36 for receiving an RF power, a secondary planar coil 20 which is coupled to the first primary coil 36 to produce an electromagnetic field in a plasma chamber, and a variable capacitor 44 for a matching adjustment.

SUMMARY OF THE INVENTION

According to one aspect of this invention, the shape and size of each inductive coil in the semiconductor processing equipment are all constant. Therefore, the extent of a processing window is limited in an extremely narrow range. Additionally, since the shape and size of the inductive coil is constant, the adjustable ranges of the processing parameters are greatly limited. Thus, the uniformity of the produced plasma becomes poorer, thereby causing a poor yield, if the processing parameters are out of certain adjustable ranges.

Therefore, it is our contemplation to increase the adjustable scope of the processing parameters of the plasma processing equipment as well as to reduce manufacturing cost by changing the shape of the coil, so as to increase the uniformity of the plasma in any processing conditions.

In view of the above, an object of the invention is to provide an inductively-coupled high density plasma producing apparatus which can increase the uniformity of a plasma and enlarge the adjustable ranges of control parameters by changing the shape of a coil, and a plasma processing equipment provided with the same.

To achieve the above object, an inductively-coupled high density plasma producing apparatus of the invention for transforming a gas in a plasma chamber into a plasma comprises an inductive coil supplied with an RF power to produce an electromagnetic field in the plasma chamber; and coil deforming means for adjusting the shape of the inductive coil by changing the height of the center thereof, thereby shifting the distribution of the electromagnetic field.

In the above-mentioned inductively-coupled high density plasma producing apparatus, the distribution of a produced plasma density can become more uniform by adjusting the shape of the inductive coil. Therefore, an enhanced uniformity of the plasma can be obtained in the plasma chamber without changing any parameters which affect the yield or throughput to control the plasma density.

Similarly, to achieve the above-stated object, the plasma processing equipment provided with the plasma producing apparatus of the invention comprises a plasma chamber for containing an element to be processed; a vacuum system for creating a pressure in the plasma chamber; a gas supply system for supplying gas to the plasma chamber. By the use of the electromagnetic field, the gas is transformed into the form of plasma and acts on the element to be processed for a specific purpose.

In the plasma processing equipment, an enhanced uniformity of plasma can be obtained by simple adjusting the inductive coil. Thus, the adjustable ranges of the parameters for different processes are expanded, the yield is increased, the adaptability of the plasma processing equipment is greatly increased and the manufacturing cost is reduced.

BRIEF DESCRIPTION OF THE DRAWINGS

The invention will become more clear from the detailed description given hereinbelow and the accompanying drawings which are given by way of illustration only and thus do not limit the present invention, and wherein.

DETAILED DESCRIPTION OF THE PREFERRED EMBODIMENTS

Figure 1:
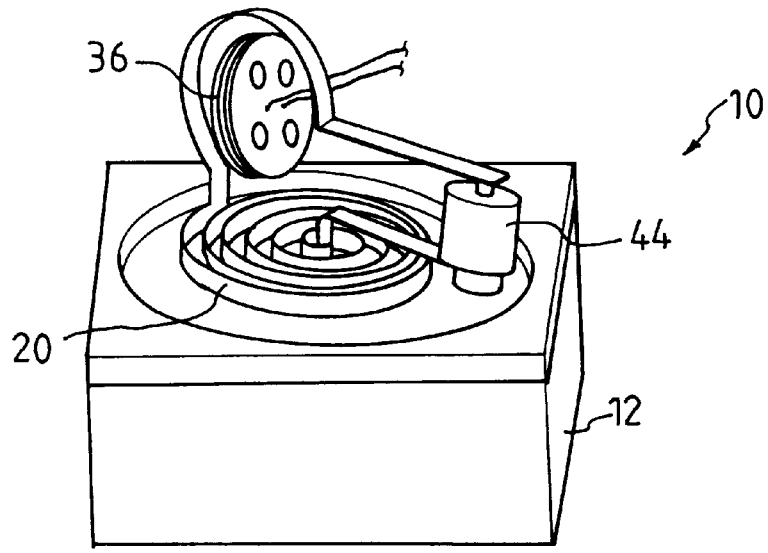
FIG. 1 is a perspective view showing a conventional plasma processing equipment for enhancing the uniformity of a plasma.
Figure 2:
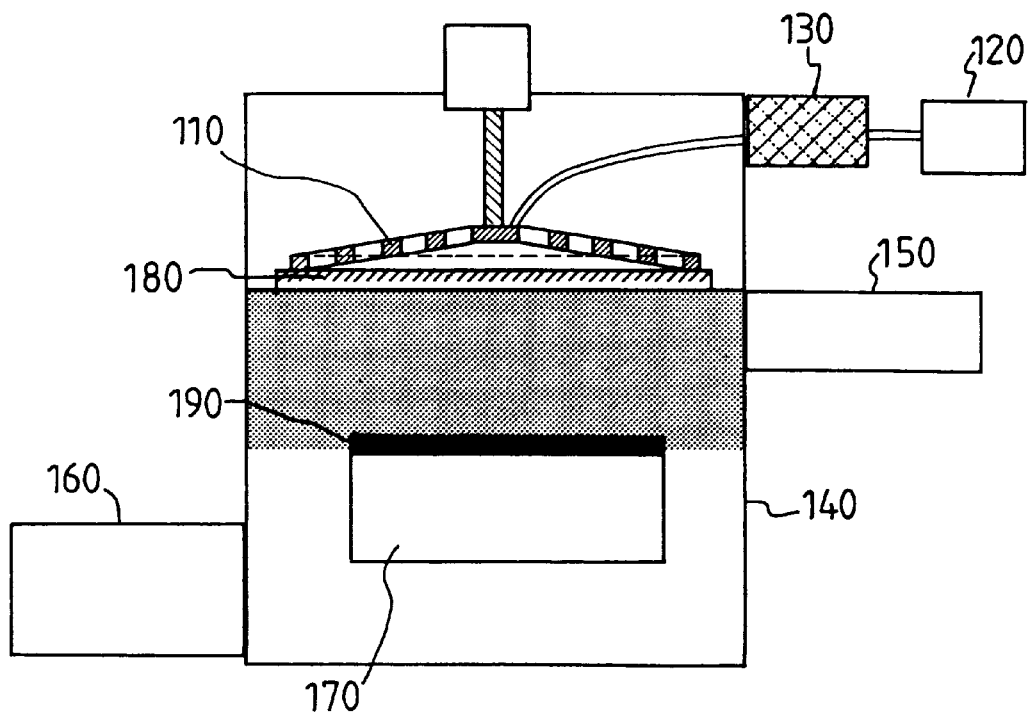
FIG. 2 is a side view showing the plasma processing equipment according to a preferred embodiment of the invention.

FIG. 2 is a side view showing the plasma processing equipment 100 according to a preferred embodiment of the invention. Referring to FIG. 2, the plasma processing equipment 100 comprises a plasma chamber 140, a gas supply system 150, a vacuum system 160, a wafer stage 170 disposed in the plasma chamber 140, and a plasma producing apparatus. The plasma producing apparatus includes an inductive coil 110, an RF power generator 120, an impedance matching network 130 and a coil adjusting means 115 for adjusting the inductive coil.

The plasma chamber 140 contains an element 190 to be processed, such as a wafer which is placed on the wafer stage 170, and provides a low-pressure environment for the generation of the plasma. The vacuum system 160 is used to maintain the plasma chamber 140 at a specific low-pressure of 1.0~100 mTorr through an outlet (not shown). The gas supply system 150 is used to supply a gas, such as hydrogen, oxygen, an inert or active gas, to the plasma chamber 140, depending on the process and the element to be processed.

The RF power generator 120 is used to supply an RF power to transform the gas in the plasma chamber 140 into a plasma by means of the inductive coil 110. The inductive coil 110 is supplied with the RF power to generate an electromagnetic field in the plasma chamber 140 through a dielectric vacuum window 180, thereby transforming the gas into plasma. The coil adjusting means 115 is used to adjust the height of the center of the inductive coil 110 so as to change the shape thereof, thereby shifting the distribution of the generated electromagnetic field. The coil adjusting means 115 comprises a coil adjuster 115a and a shaft 115b. Both ends of the shaft 115b are connected to the coil adjuster 115a and the center of the inductive coil 110. The shaft 115b is actuated by the coil adjuster 115a driven by a small electric motor. Therefore, the height of the center of the inductive coil 110 can be electrically adjusted to allow the inductive coil 110 to form a cone shape.

Figure 3:
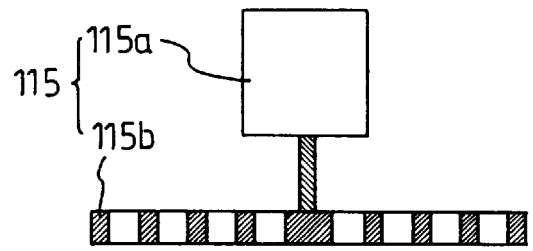
FIG. 3 is a side view showing an inductive coil which has not been deformed yet in the plasma producing equipment of FIG. 2.
Figure 4:
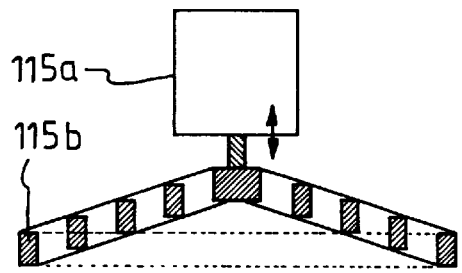
FIG. 4 is a side view showing the inductive coil in FIG. 3, which has been deformed.

FIG. 3 is a side view showing the inductive coil 110 of the plasma producing equipment of FIG. 2, which has not been adjusted yet by the coil-adjusting means 115. FIG. 4 is a side view showing the inductive coil 110 which has been adjusted by the coil adjusting means 115. As shown in FIG. 2, the inductive coil 110 is disposed above the dielectric vacuum window 180 located just above the plasma chamber 140. When the position of the center of the inductive coil 110 is raised, the distribution of an electromagnetic field induced by an RF current is shifted towards the outside, resulting in a high plasma density on the outside and a low plasma density on the center. Therefore, the uniformity of the plasma density can be controlled well by adjusting the height of the center of the inductive coil 110.

Figure 6:
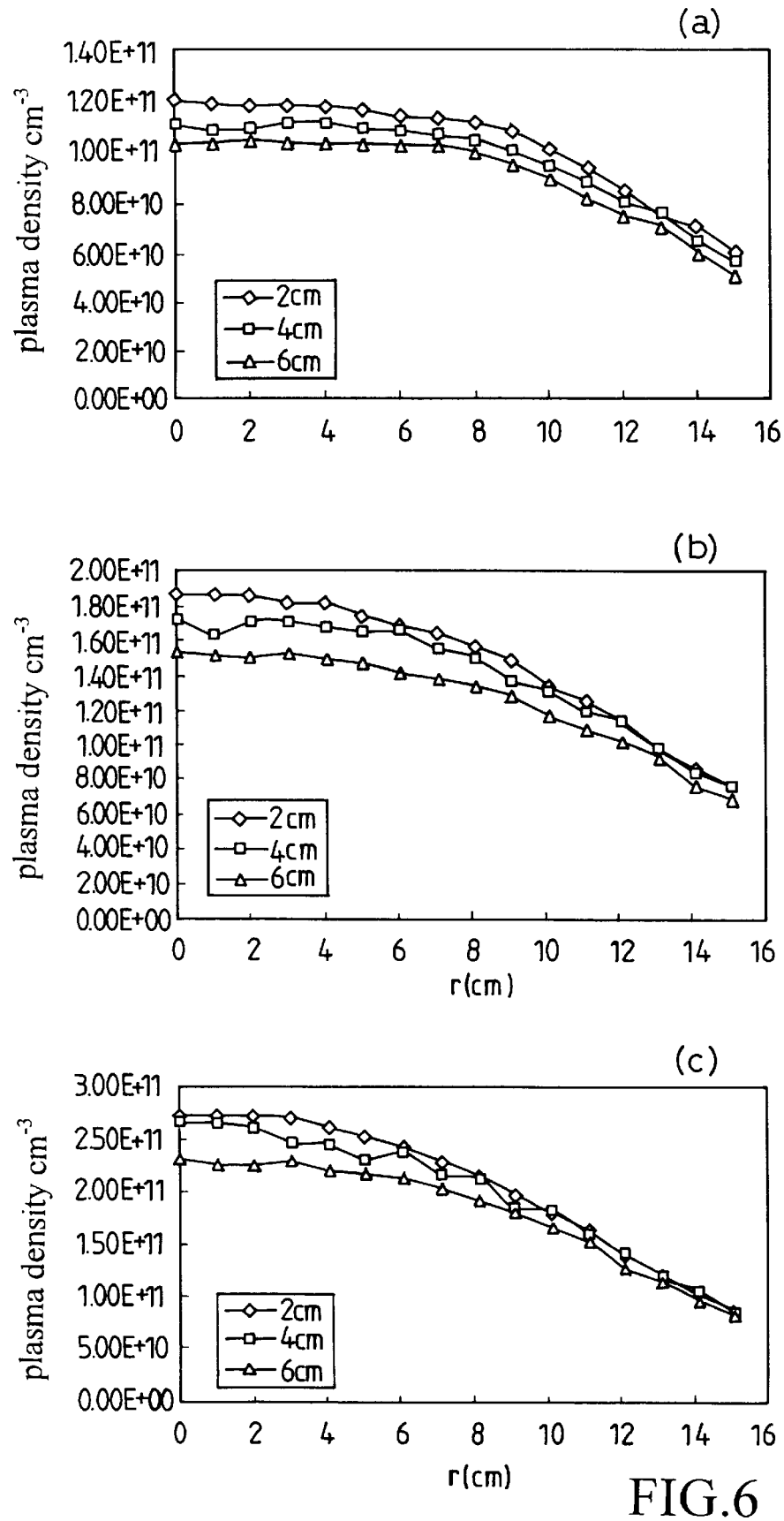
FIGS. 6(a)–6(c) are graphs showing the curves indicating the plasma density along with the change of radius positions of an inductive coil at different pressures of 5, 15 and 30 mTorr, respectively, and at different deforming amount of the inductive coil.

FIGS. 6(a)–6(c) are graphs showing the curves indicating the plasma density along with the change of the radial position of the inductive coil 110 at different pressures of 5, 15 and 30 mTorr, respectively, with the height of the center of the inductive coil 110 adjusted, wherein the power P is 400 W. As shown in FIG. 3, when the center of the inductive coil 110 is raised more, the variation of the plasma density along with the change of the radial position is smaller. That is, an enhanced uniformity of plasma can be obtained at any positions along the radial direction. Moreover, the influence to the distribution of the plasma density with respect to the change on the height of the center of the inductive coil 110 becomes more apparent at higher pressure as shown in FIG. 6(c) than at lower pressure as shown in FIG. 6(a).

On the other hand, if the inductive coil 110 consists of a conductive wire having a uniform diameter, the inductive coil 110, as being adjusted on the height of the center thereof, will not be evenly deformed since a main deformation is located closer to the margin thereof. Thus, the coneshaped inductive coil 110 shown in FIG. 4 can not be obtained. Accordingly, the diameter of an electrically conductive wire wound to form the inductive coil 110 of the invention is gradually increased from the center towards both sides thereof, so that the inductive coil 110 can be evenly deformed into a cone shape. Moreover, the shape of the inductive coil 110 can also be adjusted well by controlling the diameters of the electrically conductive wire at any different positions thereof.

Figure 5:
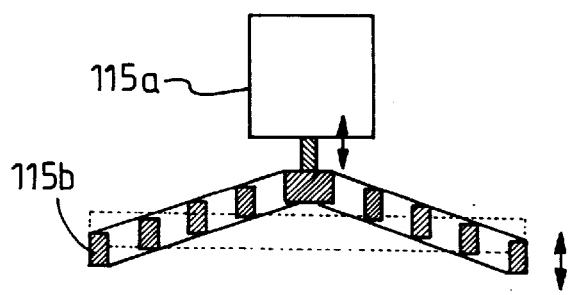
FIG. 5 is a side view showing the inductive coil in FIG. 3, which has been deformed in another form.

FIG. 5 is a side view showing another example showing deformation of the inductive coil 110. Referring to FIG. 5, in addition to raising the center of the inductive coil 110, the heights of both sides thereof can be concurrently adjusted. Thus, the height to be adjusted can be greatly increased so as to make the variation of the plasma density along with the change of the radial position becomes smaller, thereby leading to an advanced uniformity of plasma density.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications.

I claim:

1. An inductively-coupled high density plasma producing apparatus for transforming a gas in a vacuum plasma chamber into a plasma, the inductively-coupled high density plasma producing apparatus comprising:

an inductive coil for producing an electromagnetic field in the vacuum plasma chamber so as to transform the gas into the plasma; and a coil adjusting means for adjusting the shape of the inductive coil by changing the height of the center thereof, thereby shifting the distribution of the electromagnetic field and thus resulting in the change of the uniformity of the plasma density.

2. The inductively-coupled high density plasma producing apparatus of claim 1, wherein the coil adjusting means acts on the center of the inductive coil.

3. The inductively-coupled high density plasma producing apparatus of claim 1, wherein the coil adjusting means acts on both sides of the inductive coil.

4. The inductively-coupled high density plasma producing apparatus of claim 1, wherein the coil adjusting means acts on the center and both sides of the inductive coil.

5. The inductively-coupled high density plasma producing apparatus of claim 1, wherein the wire diameters of the conductive coil increase gradually from the center thereof towards both sides thereof.

6. The inductively-coupled high density plasma producing apparatus as claimed in claim 1, wherein the conductive coil has different wire diameters at different positions so as to allow the inductive coil to form a specific shape.

7. A Plasma processing equipment comprising:
a plasma chamber for containing an element to be processed;
a vacuum system for creating a low pressure in the plasma chamber;
a gas supply system for supplying a gas to the plasma chamber; and
an inductively-coupled high density plasma apparatus comprising:
an inductive coil for producing an electromagnetic field in the vacuum chamber so as to transform the gas into a plasma; and
a coil adjusting means for adjusting the shape of the inductive coil by changing the height of the center thereof, thereby shifting the distribution of the electromagnetic field and thus resulting in the change of the uniformity of the plasma density.

* * * * *